United States Patent [19]

Iwamatsu

[11] Patent Number: 4,851,842
[45] Date of Patent: Jul. 25, 1989

[54] ANALOG-TO-DIGITAL CONVERSION CIRCUIT

[76] Inventor: Masayuki Iwamatsu, c/o Yamaha Corporation, 10-1, Nakazawa-cho, Hamamatsu-shi, Shizuoka-ken, Japan

[21] Appl. No.: 214,454

[22] Filed: Jun. 30, 1988

[30] Foreign Application Priority Data

Jul. 3, 1987 [JP] Japan ............................ 62-102544[U]

[51] Int. Cl.$^4$ ............................................ H03M 1/18
[52] U.S. Cl. ..................................... 341/139; 341/132; 341/155; 341/122; 330/144; 330/145; 330/284
[58] Field of Search ............... 341/139, 132, 126, 155; 330/278, 284, 144, 145

[56] References Cited

U.S. PATENT DOCUMENTS

| | | | |
|---|---|---|---|
| 3,969,683 | 7/1976 | Fabricius | 330/144 |
| 4,276,604 | 6/1981 | Kitamura et al. | 330/284 |
| 4,383,247 | 5/1983 | Assard | 341/139 |
| 4,618,851 | 10/1986 | Watanabe | 341/139 |
| 4,683,449 | 7/1987 | Kato | 330/144 |
| 4,731,851 | 3/1980 | Christopher | 330/284 |
| 4,739,307 | 4/1988 | Marcovici et al. | 341/122 |

Primary Examiner—William M. Shoop, Jr.
Assistant Examiner—Helen Kim

[57] ABSTRACT

An analog-to-digital conversion circuit comprises a level detection circuit for detecting the level of an analog input, an amplifier for amplifying the analog input with its amplification degree increased when the detected level is smaller than a predetermined level and decreased when the detected level is larger than a predetermined level, an analog-to-digital converter for analog-to-digital converting the output the amplifier and an attenuator provided in a posterior stage of the analog-to-digital converter for attenuating the digital output of the analog-to-digital converter in association with the amplification degree of the amplifier to maintain a total gain between the analog input and the digital output substantially constant irrespective of the level of the input signal. According to the invention, an analog input is amplified by the amplifier before A/D conversion with amplification degree determined in accordance with the level of the analog input detected by the level detection circuit and the signal is attenuated after the A/D conversion in association with the amplification degree whereby the analog-to-digital converter can be utilized efficiently to higher order bits with a result that deterioration in the signal-to-noise ratio and hence reduction in the dynamic range can be effectively prevented.

4 Claims, 3 Drawing Sheets

ANALOG-TO-DIGITAL CONVERSION CIRCUIT

BACKGROUND OF THE INVENTION

This invention relates to an analog-to-digital (hereinafter abbreviated as "A/D") conversion circuit and, more particularly, to an A/D conversion circuit capable of preventing deterioration in the signal-to-noise ratio due to error occurring in A/D conversion means during application of a signal of a relatively small level and thereby preventing reduction in the dynamic range.

In conventional A/D conversion circuits, an analog input is directly converted to a digital signal irrespective of the level of the input signal.

Currently available A/D converters for household uses are not necessarily of an excellent linearity but their accuracy in conversion actually is even poorer than is generally expected. A 16-bit A/D converter, for example, has actually an accuracy of 14 bits and 2 bits of lower orders contain much conversion error. For this reason, the smaller the level of the analog input, the worse is the condition in which the A/D converter is used with resulting deterioration in the signal-to-noise ratio and, consequently, reduction in the dynamic range.

It is, therefore, an object of the invention to provide an A/D conversion circuit which has eliminated the above described disadvantage of the prior art A/D conversion circuit and is capable of preventing deterioration in the signal-to-noise ratio during application of a signal of a small level and thereby preventing reduction in the dynamic range.

SUMMARY OF THE INVENTION

For achieving the object of the invention, the A/D conversion circuit according to the invention comprises level detection means for detecting the level of an analog input, amplification means for amplifying the analog input with its amplification degree increased when the detected level is smaller than a predetermined level and decreased when the detected level is larger than a predetermined level, analog-to-digital conversion means for analog-to-digital converting the output of said amplification means and attenuation means provided in a posterior stage of said analog-to-digital conversion means for attenuating the digital output of said analog-to-digital conversion means in association with the amplification degree of said amplification means to maintain a total gain between the analog input and the digital output substantially constant irrespective of the level of the input signal.

According to the invention, an analog input is amplified by the amplification means before A/D conversion with amplification degree determined in accordance with the level of the analog input detected by the level detection means and the signal is attenuated after the A/D conversion in association with the amplification degree whereby the signal is A/D converted at a substantially constant total gain irrespective of the input level.

Since, according to the invention, an analog input is amplified before A/D conversion when this analog input is of a small level, the A/D conversion means can be utilized effectively to higher order bits which are under good condition with a result that deterioration in the signal-to-noise ratio and hence reduction in the dynamic range can be effectively prevented.

According to the invention, even if an A/D conversion output is attenuated in such a manner as to discard lower bits unconditionally, these lower bits are originally noise component so that discarding of these lower bits will not cause deterioration in the quality of the signal.

If the circuit according to the invention is constructed in such a manner that the amplification degree of the amplification means is varied with a 6 dB step and the attenuation means attenuates the signal after A/D conversion by bit-shifting (i.e., discarding predetermined lower bits), the circuit design of the attenuation means may be simplified.

The attenuation degree in the attenuation means need not necessarily be equal to the amplification degree in the amplification means. If, for example, the maximum level of the analog input is of such a small value as not to cause the digital system to be operated with its full bits, the attenuation degree in the attenuation means may be set to a lower value than the amplification degree in the amplification means so that the entire circuit will have positive gain and the digital system will be operated with full bits. Conversely, if the maximum level of the analog input is of such a large value as to overflow the digital system, the attenuation degree in the attenuation means may be set at a value higher than the amplification degree in the amplification means so that the entire circuit will have negative gain (it is possible that the amplification degree itself of the amplification means becomes of a negative value during application of a signal of a large level) to prevent the digital system from overflowing. In short, it will suffice if the amplification means and the attenuation means are operated in association with each other so that the total gain will become approximately constant.

The attenuation by the attenuation means may be effected in a posterior stage of a digital signal processing after the A/D conversion (it is possible to apply attenuation in an analog manner after digital-to-analog conversion of a signal). In this case, deterioration in the signal-to-noise ratio in a digital processing system other than A/D conversion can also be prevented.

A preferred embodiment of the invention will now be described with reference to the accompanying drawings.

BRIEF DESCRIPTION OF THE DRAWINGS

In the accompanying drawings.

DESCRIPTION OF PREFERRED EMBODIMENT

Figure 1:
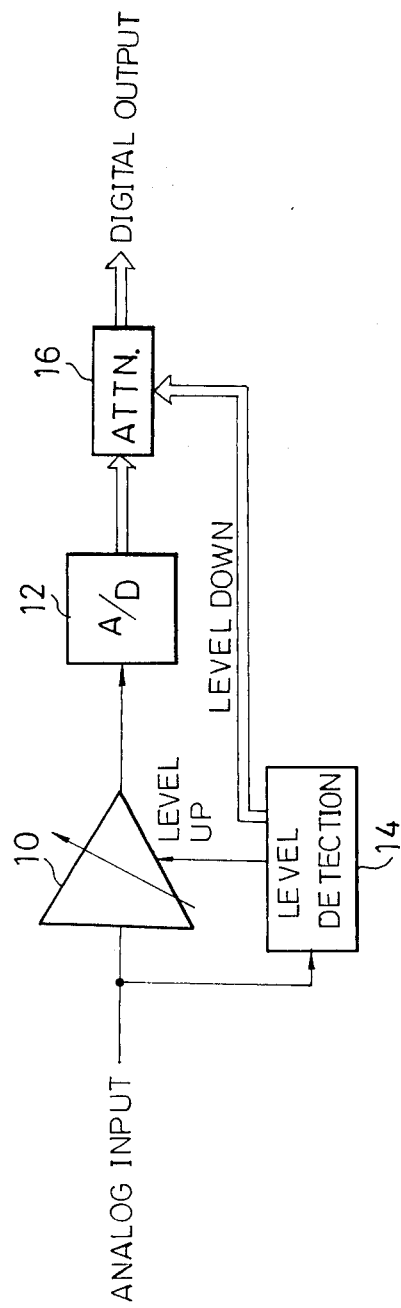
FIG. 1 is a block diagram showing an embodiment of the invention.

Referring to FIG. 1, an analog input which is to be A/D converted is applied to a variable amplifier 10. A level detection circuit 14 detects the level of the analog input and variably changes the gain of the variable amplifier 10. As the level of the input signal decreases below a predetermined level, the gain is increased so as to enable an A/D converter 12 to be used with a wider range. If the level of the input signal is larger than a predetermined level, the gain is decreased so as to prevent the A/D converter 12 from overflowing.

The analog input which has been adjusted in its level by the variable amplifier 10 is converted to a digital signal by the A/D converter 12 and thereafter is attenuated in a digital manner in correspondence to the amplification degree in the variable amplifier 10. The total gain between the input and output thereby becomes substantially constant irrespective of the level of the input signal.

An attenuator 16 can be constructed as, e.g., an attenuator in which an attenuation coefficient is multiplied. If the attenuator 16 is constructed in such a manner that attenuation of the signal is made by shifting down of lower bits, a construction merely discarding the lower bits will suffice so that the circuit design can be simplified. In this case, shift down of one bit corresponds to the attenuation amount of −6 dB so that the variable amplifier 10 is controlled in such a manner that its amplification degree changes with 6 dB step.

Figure 2:
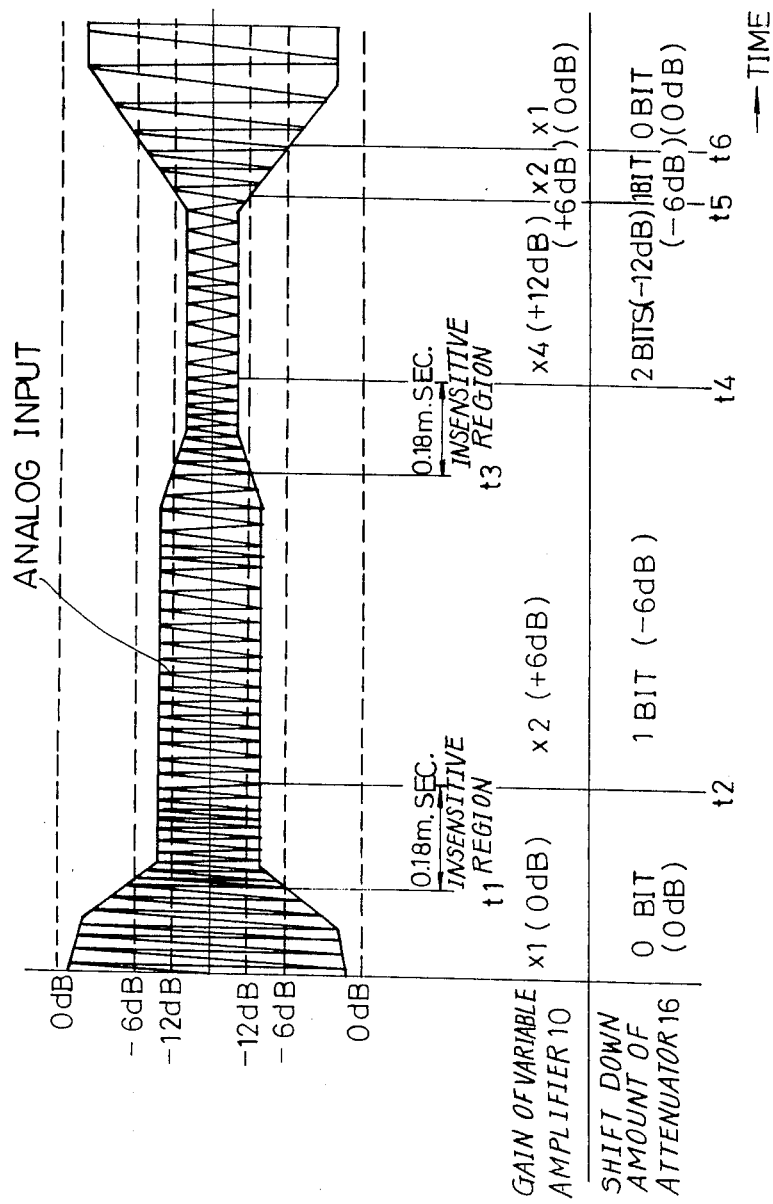
FIG. 2 is a diagram showing operation of the this embodiment.

An example of the operation of the circuit of FIG. 1 is shown in FIG. 2. In this example, the amplification degree of the variable amplifier 10 is varied with 6 dB step and the attenuator 16 effects attenuation by shifting down of lower bits. Upon detection by the level detection circuit 14 of decrease in the level of the analog input to a region of −6 to −12 dB at time point t1, the gain of the variable amplifier 10 is increased by 6 dB at time point t2 which arrives after lapse of 0.18 millisecond which is provided as an insensitive region. Simultaneously therewith (or after delay by an amount corresponding to delay in the digital system), the attenuator 16 is shifted down by one bit. Similarly, upon detection of decrease in the level of the analog input to a region below −12 dB at time point t3, the gain of the variable amplifier 10 is further increased by 6 dB (totalling 12 dB) at time point t4 which arrives after lapse of 0.18 millisecond and, simultaneously therewith or after some delay, the attenuator 16 is further shifted down by one bit (totalling 2 bits).

Upon subsequent detection of the level of the analog input which has turned to increase and entered the region of −6 to −12 dB at time point t5, the gain of the variable amplifier 10 is instantly decreased by 6 dB (totalling 6 dB). Simultaneously therewith or after some delay, the attenuator 16 is shifted up by one bit (totalling one bit shift down). Upon detection of increase in the analog input to the region of 0 to −6 dB at time point t6, the gain of the variable amplifier 10 is decreased by 6 dB (totalling 0 dB) and, simultaneously therewith or after some delay, the attenuator 16 is shifted up by one bit (total being equivalent to no bit shift).

In the foregoing manner, the A/D conversion can be made with the range of the A/D converter 12 being effectively utilized while maintaining a substantially constant total gain. Accordingly, deterioration of the signal-to-noise ratio during application of a signal of a small level can be prevented. Besides, even if the lower order bits are discarded, the discarding of these bits which are originally noise component will not adversely affect the quality of the signal.

Figure 3:
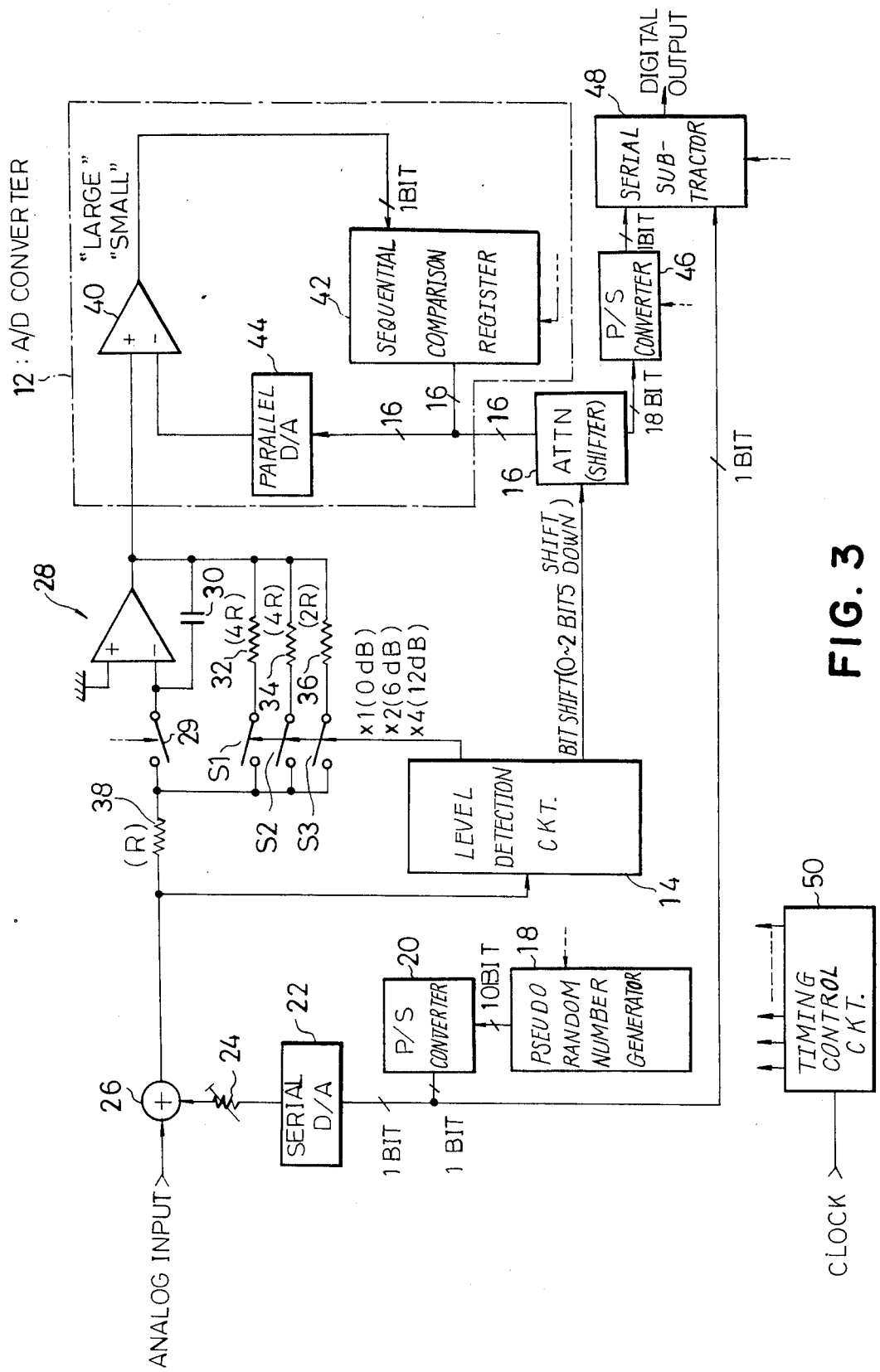
FIG. 3 is a block diagram showing a specific example of the circuit shown in FIG. 1.

A specific example of the embodiment of FIG. 1 is shown in FIG. 3.

In FIG. 3, a timing control circuit 50 produces timing control signals in respective portions of the circuit. A pseudo random number generator 18 generates noise used for dither purpose in the form of a digital signal. This noise is converted to an analog signal by a serial D/A converter 22 through a parallel/serial converter 20 and thereafter is added to the analog input signal by an adder 26 through an attenuator 24. A sum signal from the adder 26 is applied to a sample hold circuit 28 and a level detection circuit 14.

The sample hold circuit 28 switches a switch 29 with sampling frequency thereby holding a sampled value to a capacitor 30. This sample hold circuit 28 has also a function of the variable amplifier 10 of FIG. 1. More specifically, by turning on and off parallelly connected resistances 32, 34 and 36 by switches S1, S2 and S3, the gain is variably controlled. If, for example, the gain is variably controlled with 6 dB as shown in FIG. 2, values of feedback resistances 32, 34 and 36 are made 4R, 4R and 2R respectively against value R of input resistance 38. If the switches S1 through S3 are all ON, the gain becomes 0 dB. If the switches S1 and S2 are ON and the switch S3 is OFF, the output is doubled so that the gain becomes 6 dB. If the switch S1 is ON and the switches S2 and S3 are OFF, the output becomes quadrupled so that the gain becomes 12 dB.

The level detection circuit 14 detects the level of the input signal and thereupon turns on and off the switches S2 through S3. In the case of the control in FIG. 2, when the level of the input signal is 0 to −6 dB, the level detection circuit 14 turns on all of the switches S1 through S3 thereby producing the gain of 0 dB. When the level of the input signal is −6 to −12 dB, the circuit 14 turns on the switches S1 and S2 and turns off the switch S3 thereby producing the gain of 6 dB. When the level of the input signal is below −12 dB, the circuit 14 turns on the switch S1 and turns off the switches S2 and S3 thereby producing the gain of 12 dB.

The sample output of the sample hold circuit 28 is applied to the A/D converter 12. This A/D converter 12 is constructed of a sequential comparison type A/D converter. In the A/D converter 12, the sample input is applied to a comparator 40. The output of a sequential comparison register 42 is applied to a comparator 40 through a parallel digital-to-analog converter 44.

The comparator 40 sequentially compares the two inputs and produces "1" when the sample input is larger and "0" when the sample input is smaller in its bits, performing this comparison bit by bit to LSB (least significant bit). By this comparison, digital data corresponding to the output of the sample hold circuit 28 is held in the sequential comparison register 42.

The data held in the sequential comparison register 42 is applied to a shifter 16. The shifter 16 produces attenuation by bit-shifting by an amount corresponding to the amplification degree in the sample hold circuit 28. When the amplification degree is 0 dB, the shifter 16 shifts up the output (16 bits) of the sequential comparison register 42 by 2 bits and produces an output of up to 18 bits. When the amplification is 6 dB, the shifter 16 shifts up the output of the sequential comparison register 42 by one bit and adds one bit to MSB (most significant bit) and produces an output of 18 bits. When the amplification degree is 12 dB, the shifter 16 adds 2 bits to the output of the sequential comparison register 42 without shifting it up and provides this as its output. The amplified amount is thereby cancelled and the output of the sequential comparison register 42 becomes a digital signal of 18 bits.

The output of the shifter 16 is applied to a serial subtractor 48 through a parallel/serial converter 46 for subtraction of the dither component. By performing this operation each time a signal is held in the sample hold circuit 28, a digital signal is provided from the serial subtractor 48. This digital signal of 18 bits is loaded in a posterior stage digital processing system of 18 bits and processed therein. In a case where, for example, the digital processing system of the posterior stage is of 16 bits, 2 bits of the lower orders are discarded in inputting the digital signal in the digital processing system. Since these 2 bits of the lower order, however, originally contain much noise, the discarding of these 2 bits do not substantially affect the quality of the signal.

What is claimed is:

1. An analog-to-digital conversion circuit comprising:
   level detection means for detecting the level of an analog input;
   amplification means for amplifying the analog input with its amplification degree increased when the detected level is smaller than a predetermined level and decreased when the detected level is larger than a predetermined level;
   analog-to-digital conversion means for analog-to-digital converting the output of said amplification means; and
   attenuation means provided in a posterior stage of said analog-to-digital conversion means for attenuating the digital output of said analog-to-digital conversion means in association with the amplification degree of said amplification means to maintain a total gain between the analog input and the digital output substantially constant irrespective of the level of the input signal.

2. An analog-to-digital conversion circuit as defined in claim 1 wherein the amplification degree of said amplification means is varied with a 6 dB step and said attenuation means performs attenuation by bit shifting.

3. An analog-to-digital conversion circuit as defined in claim 2 wherein an insensitive region is provided in the detection of the input level by said level detection means.

4. An analog-to-digital conversion circuit as defined in claim 3 which further comprises means for producing noise used for dither, means for adding this noise to the analog input signal and means for subtracting this noise from the digital output of said analog-to-digital conversion means.

* * * * *